United States Patent [19]
Yamada

[11] Patent Number: 5,455,784
[45] Date of Patent: Oct. 3, 1995

[54] ASSOCIATIVE MEMORY DEVICE WITH SMALL MEMORY CELLS SELECTIVELY STORING DATA BITS AND DON'T CARE BITS

[75] Inventor: Hachiro Yamada, Tokyo, Japan

[73] Assignee: NEC Corporation, Tokyo, Japan

[21] Appl. No.: 288,190

[22] Filed: Aug. 9, 1994

[30] Foreign Application Priority Data

Aug. 9, 1993 [JP] Japan .................................. 5-197172
Sep. 6, 1993 [JP] Japan .................................. 5-220751

[51] Int. Cl.⁶ .................................................. G11C 15/00
[52] U.S. Cl. ................... 365/49; 365/189.07; 365/185.29
[58] Field of Search ............................. 365/49, 185, 190, 365/189.07, 230.06

[56] References Cited

U.S. PATENT DOCUMENTS

| | | | |
|---|---|---|---|
| 4,538,243 | 8/1985 | Zehner | 365/49 |
| 5,040,134 | 8/1991 | Park | 365/49 |

FOREIGN PATENT DOCUMENTS

| | | |
|---|---|---|
| 56-071886 | 6/1981 | Japan . |
| 62-165794 | 7/1987 | Japan . |
| 62-293596 | 12/1987 | Japan . |
| 63-266697 | 11/1988 | Japan . |
| 1-184790 | 7/1989 | Japan . |
| 3-55913 | 8/1991 | Japan . |

OTHER PUBLICATIONS

"Reviews and Prospects of Functional Memory LSI from the Aspect of Integration Circuit Technologies", Information Processing of Information Processing Society, vol. 32, No. 12, Dec. 1991, pp. 1239–1248.

"An 8-kbit Content Addressasble and Reentrant Memory", IEEE Journal of Solid–State Circuits, vol. SC–20, No. 5, Oct. 1985, pp. 951–957.

*Primary Examiner*—Joseph A. Popek
*Attorney, Agent, or Firm*—Foley & Lardner

[57] ABSTRACT

An associative memory cell is implemented by a series combination of two electrically erasable and programmable read only memory transistors inserted in a potential line and complementarily driven by two data lines for making one of the two electrically erasable and programmable read only memory transistors conductive depending upon the logic level of a registration data bit, and the two data lines make both of the two electrically erasable and programmable read only memory transistors conductive for storing a don't-care bit, thereby decreasing the occupation area assigned to the associative memory cell without sacrifice of usability in the associative operation.

6 Claims, 8 Drawing Sheets

ASSOCIATIVE MEMORY DEVICE WITH SMALL MEMORY CELLS SELECTIVELY STORING DATA BITS AND DON'T CARE BITS

FIELD OF THE INVENTION

This invention relates to an associative or content-addressable memory device and, more particularly, to an associative memory device with small memory cells ignoreable in associative operation.

DESCRIPTION OF THE RELATED ART

Various associative memory devices have been proposed, and typical examples are disclosed in "An 8-kbit Content-Addressable and Reentrant Memory", IEEE Journal of Solid-State Circuits, vol. SC-20, No. 5, pages 951 to 957, October 1985, and in "Reviews and Prospects of Functional Memory from the Aspect of Integrated Circuit Technologies", Information Processing of Information Processing Society, vol. 32, No. 12, pages 1239 to 1248, December 1995. Other examples are disclosed in U.S. Pat. No. 4,538,243, Japanese Patent Publication of Unexamined Application No. 56-71886, Japanese Patent Publication of Unexamined Application No. 62-165794, Japanese Patent Publication of Unexamined Application No. 62-293596, Japanese Patent Publication of Unexamined Application No. 63-266697 and Japanese Patent Publication of Unexamined Application No. 1-184790. Each of the associative memory cells disclosed therein is implemented by a memory circuit for storing a data bit accompanied with a comparator to check the stored data bit whether a reference data bit is matched with the stored data bit.

FIG. 1 illustrates the prior art associative memory cell, and a memory circuit 1 and a comparator 2 form in combination the prior art associative memory cell. The memory circuit 1 is implemented by a static type random access memory cell comprising two series combinations of p-channel enhancement type switching transistors Qp1/Qp2 and n-channel enhancement type switching transistors Qn3/Qn4 coupled in parallel between a positive power voltage line Vdd and a ground voltage line GND and two n-channel enhancement type switching transistors Qn5/Qn6 coupled between bit lines BLa/BLb and the common drain nodes N1/N2. The common drain nodes N1 and N2 are coupled to the gate electrodes of the p-channel/n-channel enhancement type switching transistors Qp2/Qn4 and Qp1/Qn3, and the n-channel enhancement type switching transistors Qn5 and Qn6 are gated by a word line WL.

The comparator 2 comprises two series combinations of n-channel enhancement type switching transistors Qn7/Qn8 and Qn9/Qn10 coupled in parallel between a hit line HIT and the ground voltage line GND. The gate electrodes of the n-channel enhancement type switching transistors Qn7 and Qn8 are respectively coupled to the common drain nodes N2 and N1, and the n-channel enhancement type switching transistors Qn9 and Qn10 are respectively gated by the bit lines BLa and BLb.

The memory circuit 1 behaves as similar to a static type random access memory cell. In the associative operation, the hit line HIT is firstly precharged, and a potential difference indicative of the reference data bit is provided on the bit lines BLa and BLb. If the reference data bit is matched with the stored data bit, the n-channel enhancement type switching transistors Qn7 and Qn9 or the other n-channel enhancement type switching transistors Qn8 and Qn10 turn on, and the hit line HIT is discharged. However, if the reference bit is not matched with the stored data bit, the n-channel enhancement type switching transistors Qn7/Qn10 or Qn8/Qn9 turn on, and the other n-channel enhancement type switching transistors electrically isolate the hit line HIT from the ground voltage line GND. The amount of current flowing through the hit line HIT is indicative of the match or the mismatch between the stored data bit and the reference bit.

Thus, the associative operation is carried out on every associative memory cell, and the comparator is indispensable for every associative memory cell. The prior art associative memory device contains a plurality of associative memory cells arranged in rows and columns, i.e., a plurality of memory circuits respectively associated with the comparators. The word line WL and the hit line HIT are provided for every row of associative memory cells, and the bit line pair BLa and BLb is provided for every column of associative memory cells.

The prior art associative memory cell thus arranged needs 10 field effect transistor, and occupies a wide area on the semiconductor chip. For this reason, only a small number of associative memory cells are integrated on a semiconductor chip, and the amount of content-addressable data codes is undesirably small.

FIG. 2 illustrates another prior art associative memory cell, and the prior art associative memory cell is implemented by a parallel combination of electrically erasable and programmable read only memory transistors 3a and 3b coupled between bit lines BLa and BLb and a hit line HIT. A word line WL is coupled to the control gate electrodes of the electrically erasable and programmable read only memory transistors 3a and 3b, and a data bit is stored in the associative memory cell by selectively injecting electrons into the floating gate electrode of either electrically erasable and programmable read only memory transistor 3a or 3b.

In detail, if a data bit of logic "1" level is stored in the associative memory cell, one of the electrically erasable and programmable read only memory transistors 3a or 3b is changed to a high threshold level through the injection of electrons. A data bit of logic "0" level is stored by changing the threshold level of the other of the electrically erasable and programmable read only memory transistors 3b or 3a.

In the associative operation, current is supplied to one of the bit lines BLa and BLb depending upon the logic level of a reference bit, and the hit line HIT is blocked from the current only when the stored data bit is matched with the reference bit.

The second prior art associative memory cell thus arranged is implemented by only two electrically erasable and programmable read only memory transistors 3a and 3b, and occupies a small amount of area rather than the first prior art associative memory cell. However, the second prior art associative memory cell encounters another problem in that the hit line HIT is only indicative of the match or the mismatch, and the data bit stored in each prior art associative memory cell is not ignoreable. If the prior art associative memory device is expected to carry out the associative operation on a variable-length data in a pattern matching sequence or a retrieval sequence for a character string, it is convenient to ignore some data bits stored in the associative memory cells as "Don't Care Bit". However, both first and second prior art associative memory devices do not allow a designer to selectively ignore the data bits stored in the associative memory cells.

FIG. 3 illustrates a third prior art associative memory cell which is allowed to be designated as a don't-care bit. The prior art-associative memory cell largely comprises a main memory circuit 4a for storing a data bit, a comparator 4b for an associative operation between the stored data bit and a reference data bit, an auxiliary memory circuit 4c for storing a mask bit and an n-channel enhancement type masking transistor Qn21 gated by the auxiliary memory circuit 4c.

The main memory circuit 4a is similar in arrangement to the memory circuit 1, and comprises a flip flop FF1 and two n-channel enhancement type switching transistors Qn22 and Qn23. The n-channel enhancement type switching transistors Qn22 and Qn23 are concurrently gated by a word line WL for electrically connecting the flip flop FF1 to bit lines BLa and BLb.

The comparator 4b is similar in arrangement to the comparator 2, and comprises two series combinations of n-channel enhancement type switching transistors Qn24/Qn25 and Qn26/Qn27 coupled in parallel between a ground line GND and the n-channel enhancement type masking transistor Qn21.

The auxiliary memory circuit 4c comprises a flip flop FF2 and n-channel enhancement type switching transistors Qn28 and Qn29, and the n-channel enhancement type switching transistors Qn28 and Qn29 are concurrently gated by a mask word line MWL for electrically connecting the bit lines BLa and BLb to the flip flop circuit FF2.

While the associative memory cell is serving as a non-ignoreable cell, the auxiliary memory circuit 4c stores a high potential level at the source node of the n-channel enhancement type switching transistor Qn29, and causes the n-channel enhancement type masking transistor Qn21 to turn on. As a result, the main memory circuit 4a and the comparator 4b behave as similar to those of the first prior art associative memory cell.

On the other hand, when the associative memory cell is designated as a don't-care bit, the mask word line MWL allows the n-channel enhancement type switching transistors Qn28 and Qn29 to turn on for storing a mask bit indicated by a potential difference with the low potential level at the source node of the n-channel enhancement type switching transistor Qn29, and the n-channel enhancement type masking transistor is turned off. For this reason, the hit line HIT is electrically isolated from the ground line GND at all times regardless of the logic level of the reference bit.

However, the third prior art associative memory cell needs the auxiliary memory circuit and the n-channel enhancement type masking transistor, and the seventeen field effect transistors are necessary for each associative memory cell.

Thus, the prior art associative memory cell has a trade-off between the occupation area and the usability, and this is the first problem.

The second problem is common to the three prior art associative memory device, and is a large amount of current consumed in the associative operation. This is because of the fact that current flows from most of the columns of associative memory cells into the hit lines.

Although the second prior art associative memory cell is non-volatile, the first and third prior art associative memory cells store the data bits in the flip flop circuits, and the data bits are lost upon power-off.

SUMMARY OF THE INVENTION

It is therefore an important object of the present invention to provide an associative memory device which is small in power consumption, stores data bits in non-volatile manner and occupies a small amount of area without sacrifice of usability.

To accomplish the object, the present invention proposes to form an associative memory cell with a pair of electrically erasable and programmable read only memory transistors complementarily gated by a pair of data lines.

In accordance with one aspect of the present invention, there is provided an associative memory device selectively entering into a registration mode and a retrieval mode, comprising: a) a plurality of addressable associative memory cells each implemented by a series combination of a first electrically erasable and programmable memory transistor and a second electrically erasable and programmable memory transistor, and formed into a plurality of associative memory cell groups; b) a plurality of pairs of data lines selectively provided for the plurality of addressable associative memory cells, the data lines of each pair being coupled to control gate electrodes of the first electrically erasable and programmable memory transistors of the associated addressable associative memory cells and control gate electrodes of the second electrically erasable and programmable memory transistors of the associated addressable associative memory cells; c) a plurality of potential lines selectively associated with the plurality of associative memory cell groups, the series combination of each of the associated addressable associative memory cells being inserted into the associated potential line; d) a variable voltage source connectable with the plurality of potential lines, and operative to supply a current to the plurality of potential lines; e) a data line driver unit coupled to the plurality of pairs of data lines, the data line driver unit being responsive to registration data bits in the registration mode for storing the registration data bits in the plurality of addressable associative memory cells, and operative to selectively energize the data lines of the plurality of pairs for changing one of the first electrically erasable and programmable memory transistor and the second electrically erasable and programmable memory transistor of each addressable associative memory cell to non-conductive state depending upon the logic level of one of the registration data bits, the data line driver unit keeping both of the first electrically erasable and programmable memory transistor and the second electrically erasable and programmable memory transistor of one of the plurality of addressable associative memory cells in conductive state when the registration bit is a don't-care bit, the data line driver unit being responsive to reference data bits in the retrieval mode for selectively energizing the data lines of each pair, and checking the plurality of associative memory cell groups to see whether or not the reference data bits are matched with the registration data bits stored in one of the plurality of associative memory cell groups, the first electrically erasable and programmable memory transistors and the second electrically erasable and programmable memory transistors of one of the plurality of associative memory cell groups being conductive when the registration data bits stored therein are matched with the reference data bits; and f) a current detecting unit connectable to the plurality of potential lines for detecting the current passing through one of the plurality of associative memory cell groups storing the registration data bits matched with the reference data bits, and operative to produce a hit signal indicative of the match between the reference data bits and the registration data bits.

In accordance with another aspect of the present invention there is provided an associative memory device selectively entering into a registration mode, a retrieval mode and an erasing mode, comprising: a) a plurality of addressable associative memory cells each implemented by a parallel combination of a first electrically erasable and programmable memory transistor and a second electrically erasable and programmable memory transistor, and formed into a plurality of associative memory cell groups; b) a plurality of pairs of data lines selectively provided for the plurality of addressable associative memory cells, the data lines of each pair being coupled to control gate electrodes of the first electrically erasable and programmable memory transistors of the associated addressable associative memory cells and control gate electrodes of the second electrically erasable and programmable memory transistors of the associated addressable associative memory cells; c) a plurality of potential lines selectively associated with the plurality of associative memory cell groups, a drain node of the first electrically erasable and programmable memory transistor and a drain node of the second electrically erasable and programmable memory transistor of each addressable associative memory cell being coupled to the associated potential line; d) a plurality of detecting lines selectively associated with the plurality of associative memory cell groups, a source node of the first electrically erasable and programmable memory transistor and a source node of the second electrically erasable and programmable memory transistor of each addressable associative memory cell being coupled to the associated detecting line; e) a first variable voltage source for producing different voltage levels depending upon the modes of operation; f) a second variable voltage source connectable with the plurality of potential lines, and operative to supply a different voltage level to the plurality of potential lines in the registration mode and the retrieval mode; g) a third variable voltage source connectable to the plurality of detecting lines, and operative to supply different voltage level depending upon the modes of operation; h) a data line driver unit supplied with the different voltage levels from the first variable voltage source for driving the plurality of pairs of data lines, the data line driver unit being responsive to registration data bits in the registration mode for storing the registration data bits in the plurality of addressable associative memory cells, and operative to selectively energize the data lines of the plurality of pairs so as to cause the first electrically erasable and programmable memory transistor and the second electrically erasable and programmable memory transistor of each addressable associative memory cell to enter into conductive-state and non-conductive state depending upon the logic level of one of the registration data bits, the data line driver unit keeping both of the first electrically erasable and programmable memory transistor and the second electrically erasable and programmable memory transistor of one of the plurality of addressable associative memory cells in the conductive state when the registration bit is a don't-care bit, the data line driver unit being responsive to reference data bits in the retrieval mode for selectively energizing the data lines of each pair, and checking the plurality of associative memory cell groups to see whether or not the reference data bits are matched with the registration data bits stored in one of the plurality of associative memory cell groups, the first electrically erasable and programmable memory transistors and the second electrically erasable and programmable memory transistors of one of the plurality of associative memory cell groups being non-conductive when the registration data bits stored therein are matched with the reference data bits; and i) a current detecting unit connectable to the plurality of detecting lines for detecting current supplied from the second variable voltage source through the plurality of associative memory cell groups storing the registration data bits mismatched with the reference data bits, and operative to produce a hit signal indicative of the match between the reference data bits and the registration data bits when no current is detected.

BRIEF DESCRIPTION OF THE DRAWINGS

The features and advantages of the associative memory device according to the present invention will be more clearly understood from the following description taken in conjunction with the accompanying drawings in which.

DESCRIPTION OF THE PREFERRED EMBODIMENTS

First Embodiment

Figure 1:
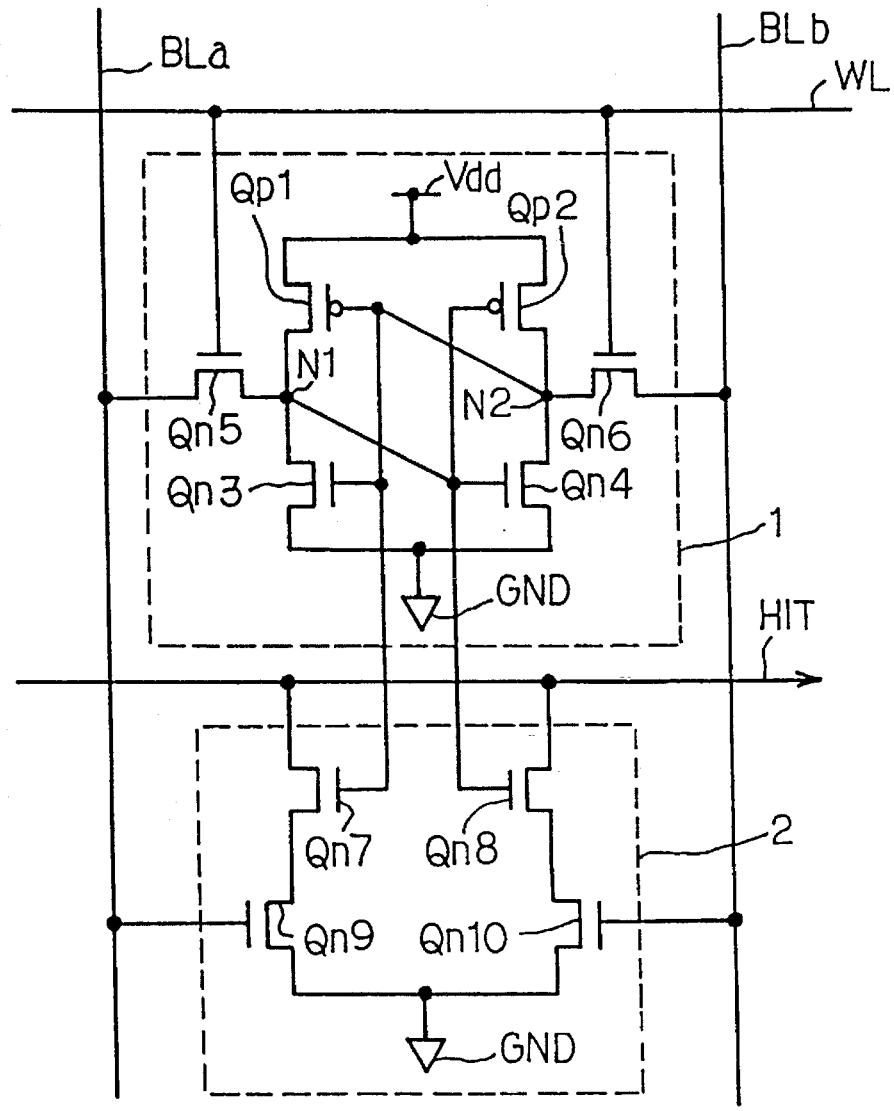
FIG. 1 is a circuit diagram showing the arrangement of the prior art associative memory cell.
Figure 2:
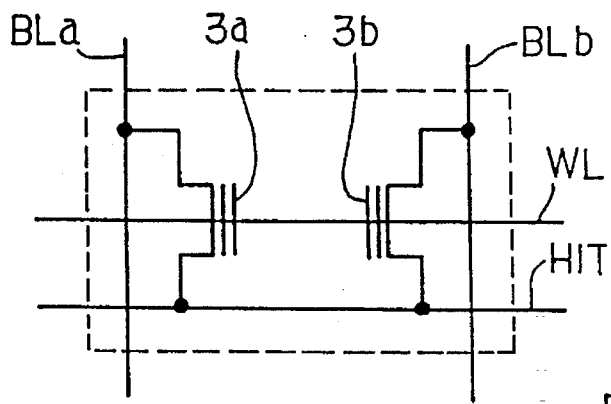
FIG. 2 is a circuit diagram showing the arrangement of another prior art associative memory cell.
Figure 3:
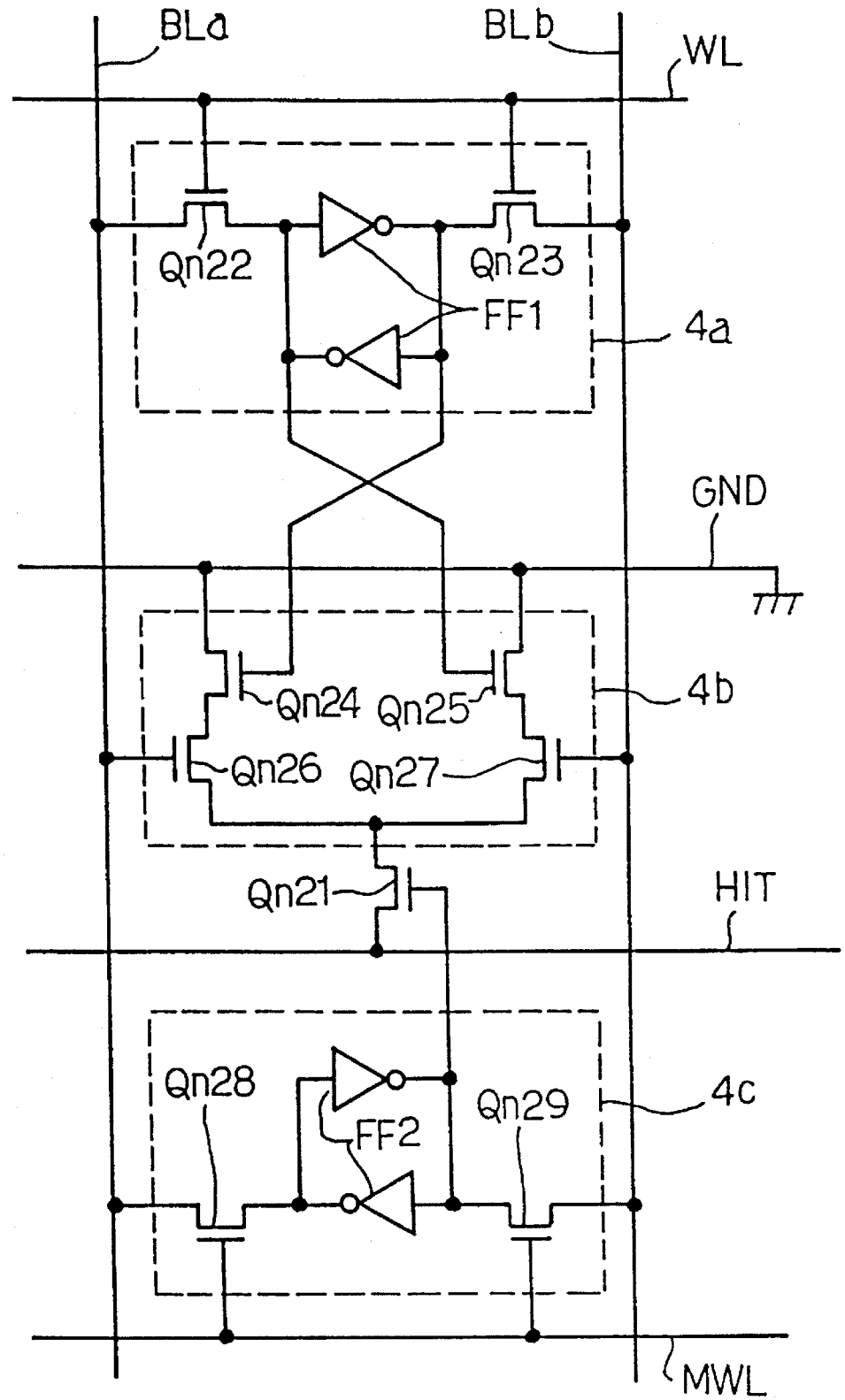
FIG. 3 is a circuit diagram showing the arrangement of yet another prior art associative memory cell.
Figure 4A:
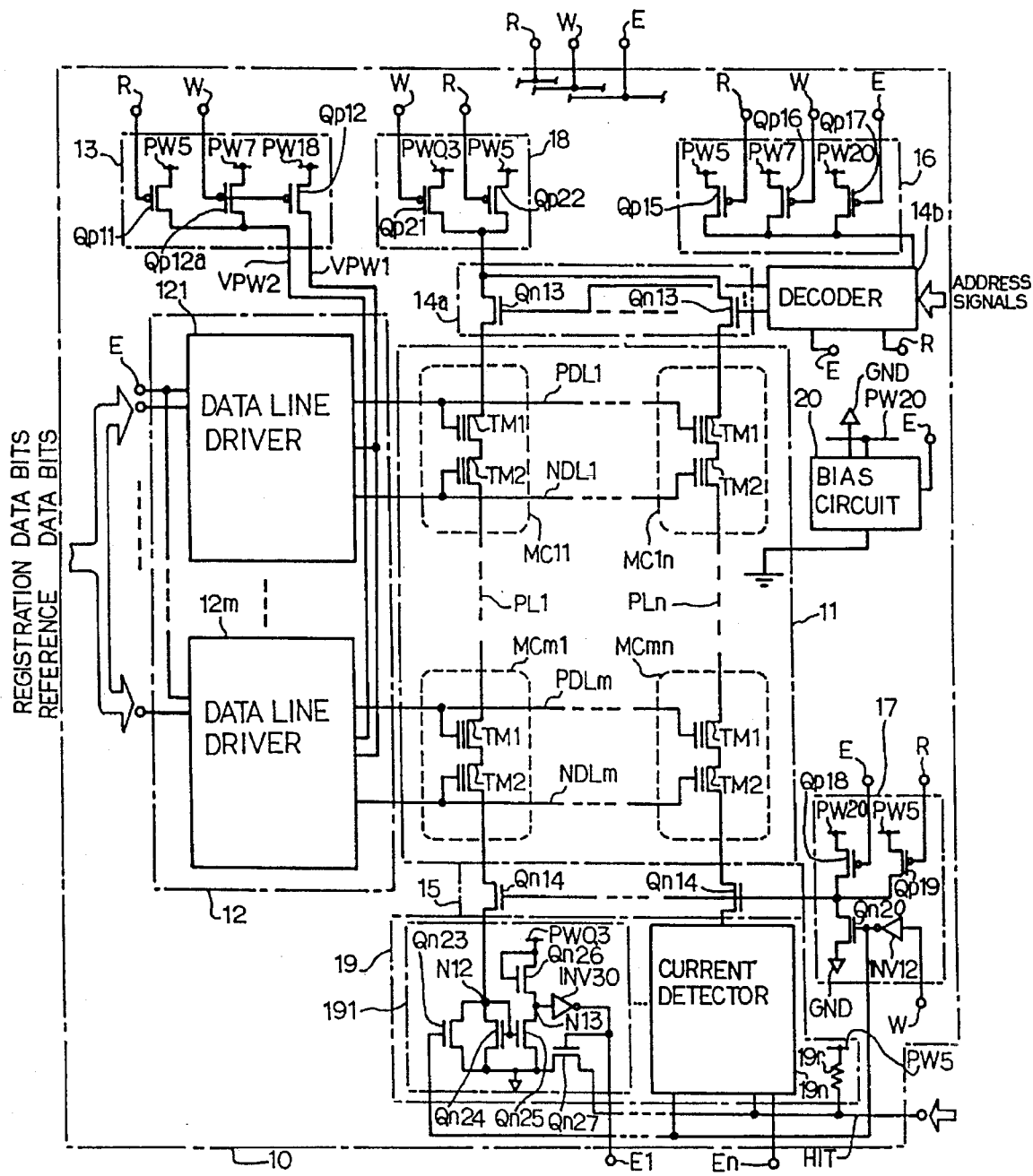
FIG. 4A is a circuit diagram showing the arrangement of a semiconductor associative memory device according to the present invention.

Referring to FIG. 4 of the drawings, a semiconductor associative memory device embodying the present invention is fabricated on a semiconductor chip 10, and selectively enters into a registration mode, a retrieval mode and an erasing mode in response to external mode control signals W, R and E. In the following description, logic "1" level and logic "0" level are assumed to be corresponding to a high voltage level and a low voltage level, respectively. The mode control signals W, R and E of the active low voltage level are indicative of the registration mode, the retrieval mode and the erasing mode, respectively.

The semiconductor associative memory device comprises an associative memory cell array 11 implemented by an array of associative memory cells MC11, . . . , MC1n, . . . , MCm1, . . . and MCmn. All of the associative memory cells MC11 to MCmn are identical in arrangement with one another, and each of the associative memory cells MC11 to MCmn is implemented by a pair of electrically erasable and programmable read only memory transistors TM1 and TM2. The electrically erasable and programmable read only memory transistor TM1 or TM2 may be a floating gate type field effect transistor the gate insulating film of which is thin enough to flow the Fowler-Nordheim tunneling current. The electrically erasable and programmable read only memory transistor TM1 or TM2 is changeable between a high threshold and a low threshold, and the high and low thresholds are indicative of the two logic levels. In this instance, the columns of associative memory cells MC11 to MC1m, ... and MC1n to MCmn serve as a plurality of associative memory cell groups.

Figure 5:
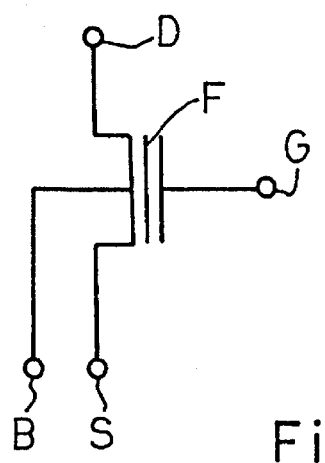
FIG. 5 is a view showing a floating gate type field effect transistor forming a part of the associative memory cell incorporated in the semiconductor associative memory device shown in FIG. 4.
Figure 6:
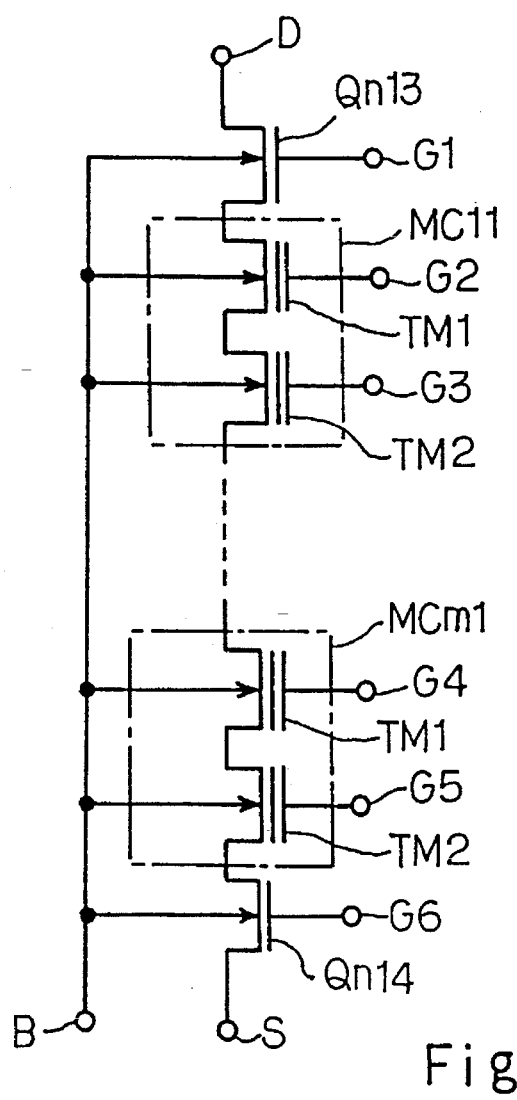
FIG. 6 is a circuit diagram showing the arrangement of a column of associative memory cells incorporated in the semiconductor associative memory device shown in FIG. 4.

The floating gate type field effect transistor is symbolized as shown in FIG. 5 of the drawings, and the relation between the modes of operation and the source voltage S, the drain voltage D, the gate voltage G and the bias voltage B to the semiconductor substrate is summarized in Table 1.

TABLE 1

|  | Erasing (Erasing) | Programming (Registration) | Read-out (Retrieval) |
| --- | --- | --- | --- |
| Drain | Open | 0.3 volt | 1 volt |
| Gate | 0 volt | 18 volt | 0 volt |
| Source | Open | 0 volt | to sense amp. |
| Substrate | 20 volts | 0 volt | 0 volt |

The floating gate type field effect transistor is described in the technical report of the electronic information communication society, ICD 91-134. In the programming, hot electrons are injected from the channel to the floating gate electrode F under the above described bias conditions, and the accumulated electrons increase the threshold thereof to 2 volts. On the other hand, the bias conditions in the erasing, the accumulated electrons are evacuated from the floating gate electrode F, and the threshold is decreased to −2 volts. In the read-out, an intermediate voltage between the high threshold and the low threshold is applied to the control gate electrode G, and the source node S is monitored to see whether or not the drain current flows out. If the electrons are accumulated in the floating gate F, no conductive channel takes place between the drain node D and the source node S, and the drain current is not detected at the source node S. On the other hand, if the electrons have been already evacuated from the floating gate F, the conductive channel bridges the drain node D and the source node S, and the drain current flows out from the source node S.

Turning back to FIG. 4 of the drawings, the electrically erasable and programmable read only memory transistors TM1 and TM2 of each associative memory cell are coupled in series, and a data bit is registered in each associative memory cell by complementarily changing the electrically erasable and programmable read only memory transistors TM1 and TM2 to the high and low thresholds.

A plurality pairs of data lines PDL1/NDL1 to PDLm/NDLm are respectively associated with the rows of associative memory cells MC11 to MC1n, ... and MCm1 to MCmn, and the data lines of each pair are connected to the control gate electrodes of the electrically erasable and programmable read only memory transistors TM1 and the control gate electrodes of the electrically erasable and programmable read only memory transistors TM2 of the associated row. The data line PDL connected to the electrically erasable and programmable read only memory transistors TM1 and the data line NDL coupled to the electrically erasable and programmable read only memory transistors TM2 are hereinbelow referred to as "positive data line" and "negative data line".

A plurality of potential lines PL1 to PLn are respectively associated with the columns of associative memory cells MC11–MCm1 to MC1n–MCmn, and the series combinations of the electrically erasable and programmable read only memory transistors TM1 and TM2 of each column are intervened in the associated potential line.

The semiconductor associative memory device further comprises a data line driver unit 12 for selectively driving the positive and negative data lines PDL/NDL. The data line driver unit 12 has a plurality of data line drivers 121 to 12m respectively associated with the plurality pairs of data lines PDL1/NDL1 to PDLm/NDLm, and each of the data line drivers 121 to 12m selectively drives the positive data line PDL and the negative data line of the associated pair depending upon the logic level of a registration data bit or a reference data bit.

Figure 4B:
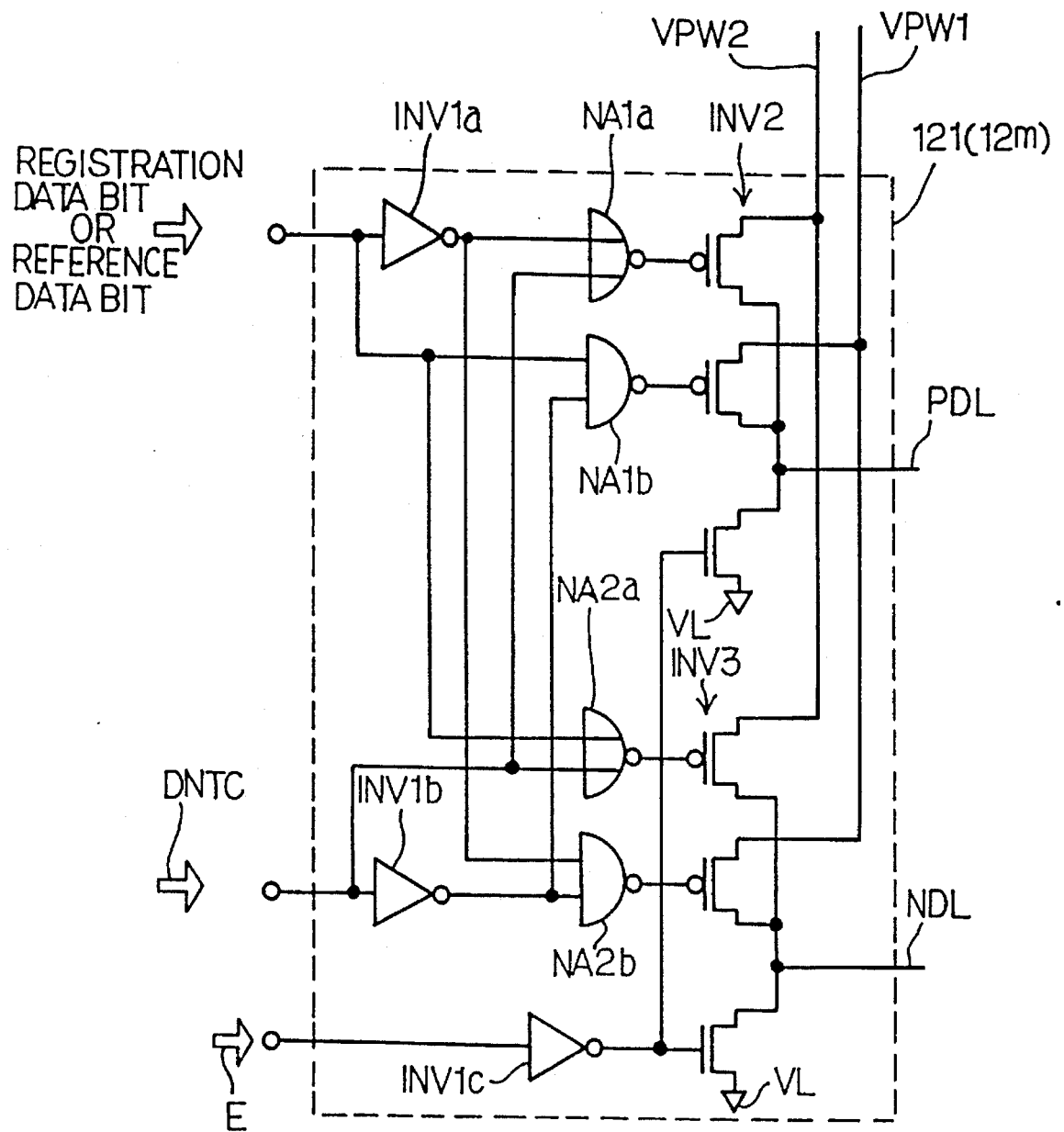
FIG. 4B is a circuit diagram showing the arrangement of a data line driver incorporated in the semiconductor associative memory device.

The data line drivers 121 to 12m are identical in circuit arrangement with one another, and each of the data line drivers 121 to 12m has inverters INV1a, INV1b and INV1c, NAND gates NA1a, NA1b, NA2a and NA2b and two drivers INV2 and INV3 as shown in FIG. 4B. The inverters INV1a and INV1b produce the complementary registration data bit/the complementary reference data bit and the complementary don't-care bit from the given registration data bit/the given reference data bit and a don't-care bit DNTC. The given data bit and the complementary data bit are respectively supplied to the NAND gates NA1b /NA2a and the NAND gates NA1a /NA2b. The don't-care bit DNTC and the complementary signal thereof are supplied to the NAND gates NA1a/NA2a and the NAND gates NA1b/NA2b. The drivers INV2 and INV3 are enabled with the complementary signal of the mode control signal E, and are controlled by the NAND gates NA1a/NA1b and the NAND gates NA2a/NA2b. The drivers INV2 and INV3 are coupled between a write-in power supply line VPW1/a variable power supply line VPW2 and another voltage line VL, and the output nodes N10 and N11 are coupled to the positive data line PDL (PDL1, ... or PDLm) and the negative data line NDL (NDL1, ... or NDLm), respectively.

When the registration data bit or the reference data bit is supplied to the data line driver, the don't-care bit DNTC is logic "0" level, and the NAND gates NA1a and NA2a isolate the drivers INV2 and INV3 from the variable power supply line VPW2. On the other hand, the complementary bit of the don't-care bit enable the NAND gates 1b and 2b, and the NAND gates NA1b and NA2b cause the drivers INV2 and INV3 to selectively couple the write-in power supply line VPW1 and the voltage line GND to the positive data line PDL and the negative data line NDL. The voltage line VL is supplied with 0 volt in the erasing mode and with 7 volts in the registration mode.

If the don't-care bit DNTC of logic "1" level is supplied to the data line driver, the NAND gates 1b and 2b are diabled, and the NAND gates 1a and 2a are enabled with the complementary bit of the don't-care bit DNTC. As a result, the drivers INV2 and INV3 are isolated from the write-in power supply line VPW1, and the drivers INV2 and INV3 selectively couple the variable power supply line VPW2 to the positive data line PDL and the negative data line NDL.

Turning back to FIG. 4A of the drawings, the semiconductor associative memory device further comprises a first variable power source 13 for the positive data lines PDL1 to PDLm, and p-channel enhancement type switching transistors Qp11, Qp12 and Qp12a form in combination the first variable power source 13. The p-channel enhancement type switching transistors Qp11, Qp12 and Qp12a are coupled between a first power voltage line PW5, a second power voltage line PW18 and a third power voltage line PW7 and a variable power voltage line VPW2 and the write-in power supply line VPW1, and the first power voltage line PW5, the second power voltage line PW18 and the third power voltage line PW7 are set to 5 volts, 18 volts and 7 volts, respectively.

The mode control signals R and W are respectively supplied to the gate electrodes of the p-channel enhancement type switching transistors Qp11 and Qp12a/Qp12, and the first variable power source 13 selectively supplies a detecting gate voltage at 5 volts to the variable power supply line VPW2 in the retrieval mode and a transfer voltage level at 7 volts and a write-in gate voltage at 18 volts to the power supply lines VPW2 and VPW1.

The semiconductor associative memory device further comprises transfer gate arrays 14a and 15, and the transfer gate arrays 14a and 15 are provided on both sides of the potential lines PL1 to PLn, respectively.

The transfer gate array 14a is associated with a decoder 14b, and address signals are supplied to the decoder 14b in the registration mode. The transfer gate array 14a has a plurality of n-channel enhancement type transfer transistors Qn13 respectively coupled to the potential lines PL1 to PLn, and the decoder 14b causes the n-channel enhancement type transfer transistors Qn13 to selectively turn in response to the address signals in the registration mode. However, the decoder 14b allows all of the n-channel enhancement type transfer transistors Qn13 to concurrently turn on in the retrieval mode and the erasing mode. The gate voltage for the n-channel enhancement type transfer transistors Qn13 is variable depending upon the mode of operation as will be described hereinlater. In this instance, the transfer gate array 14a and the decoder 14b as a whole constitute an addressing unit.

The transfer gate array 15 is also implemented by a plurality of n-channel enhancement type transfer transistors Qn14, and the potential lines PL1 to PLn are respectively coupled to the n-channel enhancement type transfer transistors Qn14. The n-channel enhancement type transfer transistors Qn14 are gated by a gate controller 17, and are concurrently changed between one-state and off-state.

The gate control circuit 16 has three p-channel enhancement type switching transistors Qp15, Qp16 and Qp17 coupled between the first power voltage line PW5, the third power voltage line PW7 and a fourth power voltage line PW20 and the gate electrodes of the n-channel enhancement type transfer transistors Qn13. The third power voltage line PW7 and the fourth power voltage line PW20 are set to 7 volts and 20 volts, respectively. The mode control signals R, W and E are respectively supplied to the gate electrodes of the p-channel enhancement type switching transistors Qp15, Qp16 and Qp17, and cause the p-channel enhancement type switching transistors Qp15, Qp16 and Qp17 to selectively turn on so as to supply 5 volts, 7 volts and 20 volts in the retrieval mode, the registration mode and the erasing mode. The power voltage at 7 volts is supplied through the decoder 14b to the gate electrode of the selected n-channel enhancement type transfer transistor Qn13 in the registration mode, and only the selected n-channel enhancement type transfer transistor Qn13 turns on for supplying a voltage level to the associated potential line. However, the power voltage at 5 volts are distributed through the decoder 14b to the gate electrodes of all the n-channel enhancement type transfer transistors Qn13, and a voltage level is distributed to all of the potential lines PL1 to PLn in the retrieval mode. The power voltage at 20 volts is also supplied through the decoder 14b to the gate electrodes of all the n-channel enhancement type transfer transistors Qn13.

The gate control circuit 17 has an inverter, two p-channel enhancement type switching transistors Qp18 and Qp19 and an n-channel enhancement type switching transistor Qn20. The inverter INV2 inverts the mode control signal W, and supplies the inverted mode control signal to the gate electrode of the n-channel enhancement type switching transistor Qn20. The p-channel enhancement type switching transistors Qp18 and Qp19 are coupled between the fourth power voltage line PW20 and the first power voltage line and the gate electrodes of the n-channel enhancement type transfer transistors Qn14, and the n-channel enhancement type switching transistor Qn20 is coupled between the ground voltage line and the gate electrodes of the n-channel enhancement type transfer transistors Qn14. The p-channel enhancement type switching transistors Qp18 and Qp19 are respectively gated by the mode control signals E and R, and the gate control circuit 17 selectively supplies 20 volts, 5 volts and the ground voltage level to the gate electrodes of the n-channel enhancement type transfer transistors Qn14 depending upon the mode of operation.

The semiconductor associative memory device further comprises a second variable power source 18 for the potential lines PL1 to PLn, and the second variable power source 18 is implemented by p-channel enhancement type switching transistors Qp21 and Qp22. The p-channel enhancement type switching transistors Qp21 and Qp22 are coupled between the first power voltage line PW5 and a fifth power voltage line PW0.3 and the transfer gate array 14a, and the fifth power voltage line PW0.3 is set to 0.3 volt. The p-channel enhancement type switching transistors Qp21 and Qp22 are gated by the mode control signals W and R, and the second variable power source 18 selectively supplies 0.3 volt and 5 volts through the transfer gate array 14a to the potential lines PL1 to PLn depending upon the mode of operation. Namely, the power voltage at 0.3 volt is supplied through the transfer gate array 14a to one of the potential lines PL1 to PLn in the registration mode, and the power voltage level at 5 volts is distributed through the n-channel enhancement type transfer transistors Qn13 to all of the potential lines PL1 to PLn.

The semiconductor associative memory device further comprises a detecting unit 19 to see whether or not a reference data code is matched with a registered data code stored in the associative memory cell array 11. The detecting unit 19 has a plurality of current detecting circuits 191 to 19n coupled to a hit line HIT and a resistor 19r coupled between the first power voltage line PW5 and the hit line HIT, and all of the current detecting circuits 191 to 19n are identical in circuit arrangement with one another.

Each of the current detecting circuits 191 to 19n comprises an n-channel enhancement type enabling transistor Qn23 coupled to the associated potential line, a parallel combination of n-channel enhancement type current-detecting transistors Qn24 and Qn25 gated by the associated potential line, an n-channel enhancement type load transistor Qn26 coupled between the power voltage line and the n-channel enhancement type current-detecting transistor Qn25, an inverter INV3a coupled between the drain of the n-channel enhancement type load transistor Qn26 and an address pin E1, . . . or En and an n-channel enhancement type transfer transistor Qn27 coupled between the parallel combination and the hit line HIT. The source nodes of the n-channel enhancement type transistors Qn23, Qn25 and Qn27 are coupled to the ground votage line. The complementary signal of the mode control signal W is supplied from the inverter INV2 to the gate electrode of the n-channel enhancement type enabling transistor Qn23, and the n-channel enhancement type transfer transistor Qn27 is gated by the inverter INV3a. The resistor 19r pulls up the high line HIT in case of a mismatch between the stored data codes and the reference data code.

While the semiconductor associative memory device is in the retrieval mode, the mode control signal W is maintained in the high voltage level, and the inverter INV2 supplies the low voltage level to the gate electrode of the n-channel enhancement type enabling transistor Qn23. As a result, the n-channel enhancement type enabling transistor Qn23 is turned off, and the current on the associated potential line is converted into a voltage level at the drain node N12. If only a negligible amount of current flows into the node N12, the voltage level at the node N12 is relatively low, and the n-channel enhancement type current-detecting transistors Qn24 and Qn25 are highly resistive. As a result the current from the n-channel enhancement type load transistor Qn26 produces a high voltage level at the node N13 over the threshold of the inverter INV3a, and the inverter INV3a keeps the output signal thereof to the low voltage level. This results in that the n-channel enhancement type transfer transistor Qn27 is turned off.

On the other hand, if a substantial amount of current flows from the associated potential line to the node N12, the voltage level at the node N12 is increased, and the n-channel enhancement type current-detecting transistors Qn24 and Qn25 decrease the channel conductances thereof. As a result, the voltage level at the node N13 is lowered below the threshold of the inverter INV3a. This results in the high voltage level at the output node of the inverter INV3a, and the n-channel enhancement type transfer transistor Qn27 turns on for transferring the current to the high line HIT. The column of associative memory cells storing a registration data code matched with the reference data code is reported by changing the associated address pin E1 to En to the high voltage level.

Thus, the current detectors 191 to 19n discriminate the currents on the associated potential lines PL1 to PLn, and independently provide current paths to the high line HIT.

The semiconductor associative memory device further comprises a bias circuit 20 for the semiconductor substrate 10, and the bias circuit 20 biases the semiconductor substrate 10 to one of zero volt and 20 volts. Namely, the bias circuit 20 is responsive to the mode control signal E, and changes the bias voltage. If the mode control signal E is changed to the active low voltage level indicative of the erasing mode, the bias circuit 20 applies 20 volts to the part of the semiconductor substrate 10 assigned to the memory cell array 11. On the other hand, while the semiconductor associative memory device is in the registration mode and the retrieval mode, the semiconductor substrate 10 is maintained at zero volt.

Description is hereinbelow made on the circuit behavior in the three modes of operation. The erasing mode, the registration mode and the retrieval mode are represented by the mode control signal E of the active low voltage level, the mode control signal W of the active low voltage level and the mode control signal R of the active low voltage level, respectively, and the other mode control signals, i.e., the mode control signals W and R in the erasing mode, the mode control signals E and R in the registration mode and the mode control signals E and W in the retrieval mode are maintained in the inactive high voltage level.

First, the semiconductor associative memory device is assumed to enter into the erasing mode. The first variable voltage source 13 isolates the write-in power supply line VPW1 the variable power supply line VPW2 from the first, second and third power voltage lines PW5, PW18 and PW7, and the second variable voltage source 18 causes the drain nodes of the electrically erasable and programmable read only memory transistors TM1 and TM2 to enter in open state.

Since the mode control signal E is in the active low voltage level, the inverters INV1c cause the drivers INV2 and INV3 to connect the positive data lines PDL1/PDLm and the negative data line NDL1/NDLm to the voltage line VL, and the ground voltage level is supplied through the drivers INV2 and INV3 to the positive and negative data lines PDL1/NDL1 to PDLm/NDLm. As a result, the control gate electrodes of the electrically erasable and programmable read only memory transistors TM1 and TM2 are maintained at the ground voltage level.

The gate control circuits 16 and 17 are responsive to the mode control signal E of the active low voltage level for supplying 20 volts to the gate electrodes of the n-channel enhancement type transfer transistors Qn13 and Qn14, and the potential lines PL1 to PLn are coupled to the second variable voltage source 18 and the detecting unit 19. The p-channel enhancement type switching transistors Qp21 and Qp22 are turned off, and the n-channel enhancement type enabling/switching transistors Qn23 and Qn24 are turned off in the erasing mode. As a result, the potential lines PL1 to PLn are maintained in open state.

The bias circuit 20 is responsive to the mode control signal E for biasing the part of the semiconductor substrate 11 to 20 volts, and accumulated electrons are evacuated to the semiconductor substrate 10 as the tunnel current. As a result, all of the electrically erasable and programmable read only memory transistors TM1 and TM2 enter into the erased state, and the threshold of each electrically erasable and programmable read only memory transistor TM1/TM2 has the low threshold around −2 volts.

Subsequently, the semiconductor associative memory device is assumed to enter into the programming mode, and the column of associative memory cells MC11 to MCm1 are, by way of example, selected from the memory cell array 11.

The gate control circuit 16 is responsive to the mode control signal W of the active low voltage level for supplying 7 volts to the decoder 14b, and the decoder 14b causes the leftmost n-channel enhancement type transfer transistor Qn13 to turn on.

The other gate control circuit 17 supplies the ground voltage to the gate electrodes of the n-channel enhancement type transfer transistors Qn14 in response to the mode control signal W.

The second variable voltage source 18 is also responsive to the mode control signal W for supplying 0.3 volt to the transfer gate array 14a, and the leftmost n-channel enhancement type transfer transistor Qn13 transfers 0.3 volt to the potential line PL1.

The bias circuit 20 maintains the semiconductor substrate 10 at the ground voltage level.

The first variable voltage source 13 is also responsive to the mode control signal W for supplying the transfer voltage level at 7 volts and the write-in voltage level at 18 volts to the data line driver unit 12. The voltage line VL is supplied with 7 volts.

The registration data bits (1 . . . 0) are respectively supplied to the data line driver circuits 121 to 12m, and the mode control signal E of the inactive logic "1" level isolates the drivers INV2 and INV3 from the voltage line VL. The NAND gates NA1a and 2a are disabled, and the NAND gates 1b and 2b are enabled.

The data line driver 121 is responsive to the registration data bit of logic "1" level, and the NAND gates NA1b and NA2b of the data line driver 121 cause the drivers INV2 and INV3 to supply 18 volts and 7 volts to the positive data line PDL1 and the negative data line NDL1. As a result, electrons are injected into the floating gate F of the electrically erasable and programmable read only memory transistor TM1, and the electrically erasable and programmable read only memory transistor TM2 transfers the drain voltage of 0.3 volt to the next associative memory cell. The electrically erasable and programmable read only memory transistor TM1 changes the threshold to the high level, and the other electrically erasable and programmable read only memory transistor TM2 remains in the erased state or the low threshold level.

On the other hand, the registration data bit of logic "0" level is supplied to the data line driver circuit 12m, and the drivers INV2 and INV3 supplies 7 volts and 18 volts to the positive data line PDLm and the negative data line NDLm, and the electrons are injected to the electrically erasable and programmable read only memory transistor TM2. Thus, the electrically erasable and programmable read only memory transistor TM2 changes the threshold to the high level. However, the other electrically erasable and programmable read only memory transistor TM1 remains in the erased state.

Thus, the pair of electrically erasable and programmable read only memory transistors TM1 and TM2 are selectively changed to the high threshold and the low threshold depending upon the logic level of the registration data bit.

In order to store a don't-care bit "x" in one of the associative memory cells MC11 to MCmn, the data line driver circuit keeps both positive and negative data lines at 7 volts, and allow both electrically erasable and programmable read only memory transistors TM1 and TM2 to remain in the erased state.

The erasing operation and the registration are summarized in Table 2.

TABLE 2

| Node | Erasing | Reg. "1" | Reg. "0" | Reg. "x" |
| --- | --- | --- | --- | --- |
| D | Open | 0.3 volt | 0.3 volt | 0.3 volt |
| G1 | 20 volts | 7 volts | 7 volts | 7 volts |
| G2 | 0 volt | 18 volts | 7 volts | 7 volts |
| G3 | 0 volt | 7 volts | 18 volts | 7 volts |
| G6 | 20 volts | 0 volt | 0 volt | 0 volt |
| S | Open | 0 volt | 0 volt | 0 volt |
| B | 20 volts | 0 volt | 0 volt | 0 volt |

Finally, assuming now that the semiconductor associative memory device enters into the retrieval mode. The first and second variable voltage sources 13 and 18 are responsive to the mode control signal R, and supply 5 volts to the variable power voltage line VPW2 and the transfer gate array 14a. The voltage line VL is coupled to the ground voltage line.

The gate control circuit 16 supplies 5 volts through the decoder 14b to all of the gate electrodes of the n-channel enhancement type transfer transistors Qn13 in response to the mode control signal R, and the transfer gate array 14a passes current from the second variable voltage source 18 to the potential lines PL1 to PLn.

The gate control circuit 17 is also responsive to 5 volts for supplying 5 volts to the gate electrodes of the n-channel enhancement type transfer transistors Qn14, and the n-channel enhancement type transfer transistors Qn14 couple the potential lines PL1 to PLn to the associated current detectors 191 to 19n.

The bias circuit 20 maintains the semiconductor substrate 10 at the ground voltage level.

A reference data bits are supplied to the data line driver circuits 121 to 12m, and the data line driver circuits 121 to 12m selectively supply 5 volts and 0 volt to the associated positive and negative data lines PDL1/NDL1 to PDLm/NDLm. If the don't-care bit is contained, the data line driver drives the associated positive and negative data lines to 5 volts.

Figure 7:
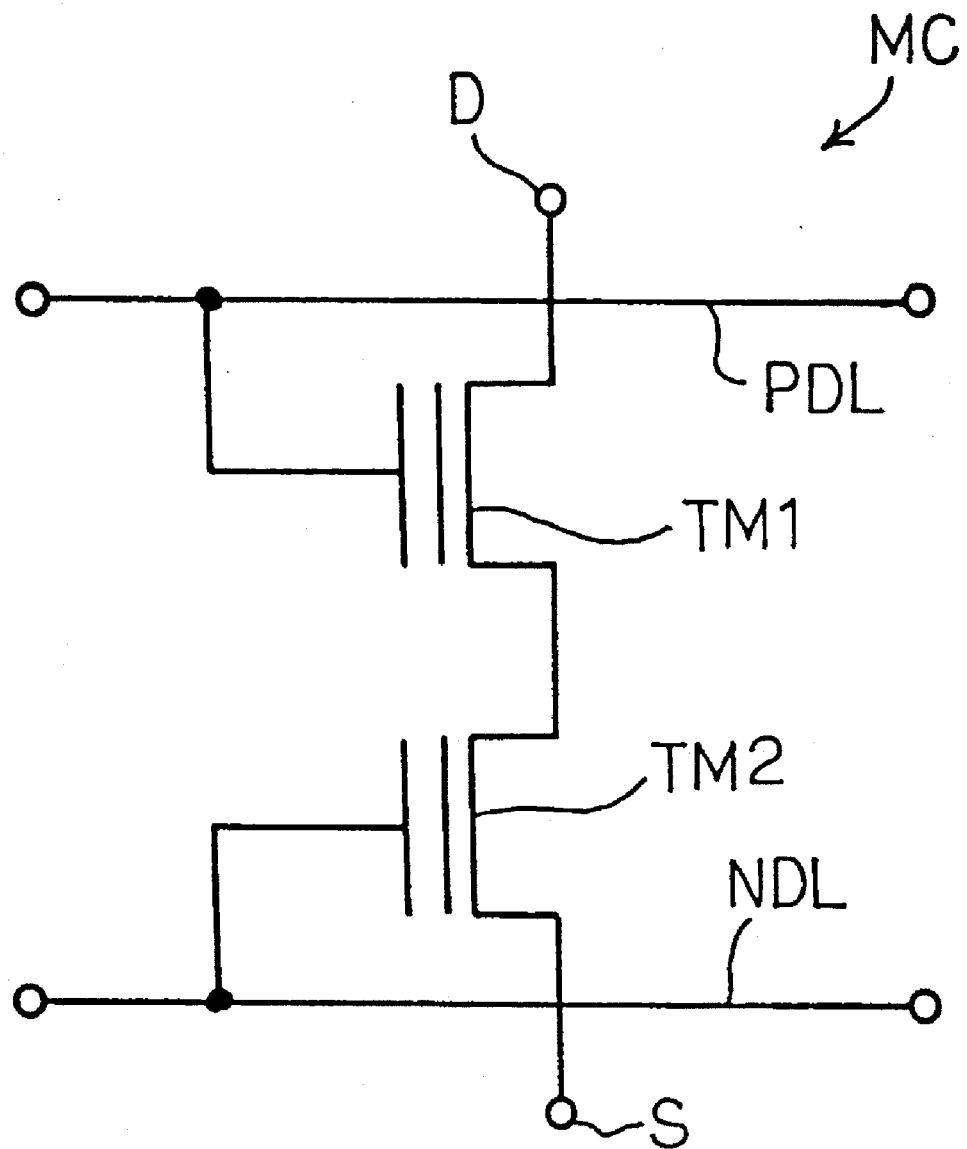
FIG. 7 is a circuit diagram showing the arrangement of each associative memory cell incorporated in the semiconductor associative memory device shown in FIG. 4.

The electrically erasable and programmable read only memory transistors TM1 and TM2 of each associative memory cell MC are coupled between the drain node D and the source node S, and are gated by the positive and negative data lines PDL and NDL as shown in FIG. 7. The positive and negative data lines PDL and NDL cause the electrically erasable and programmable read only memory transistors TM1 and TM2 to selectively turn on and off depending upon the reference data bit as described in Table 3.

TABLE 3

| | | logic "1" | | logic "0" | | Mask | |
| --- | --- | --- | --- | --- | --- | --- | --- |
| Reference bit | | PDL | NDL | PDL | NDL | PDL | NDL |
| Data line | | 5 v | 0 v | 0 v | 5 v | 5 v | 5 v |
| R e g i s t | "1" | Vth1> 0 Vth2< 0 | ON | ON | OFF | ON | ON | ON |
| | "0" | Vth1< 0 Vth2> 0 | ON | OFF | ON | ON | ON | ON |
| b i t | "x" | Vth1< 0 Vth2< 0 | ON | ON | ON | ON | ON | ON |
| | | | TM1 | TM2 | TM1 | TM2 | TM1 | TM2 |

Thus, if the registered data bit is matched with the reference data bit, both electrically erasable and programmable read only memory transistors TM1 and TM2 turn on, and the drain D is electrically connected to the source S. However, if the registered data bit is not matched with the reference data bit, either electrically erasable and programmable read only memory transistor TM1 or TM2 turns off, and the source S is electrically isolated from the drain D.

On the other hand, if the registered data bit is the don't-care bit "x" or the reference data bit is a mask bit, both electrically erasable and programmable read only memory transistors TM1 and TM2 turn on, and the drain D is electrically connected to the source S.

For this reason, if the reference data bits are matched with the registration data bits stored in one of the columns of associative memory cells, the current flows through the column of associative memory cells, and the associated current detector changes the associated address bit E1, . . . or En to the high voltage level. Moreover, the current detector transfers the current to the hit line HIT.

When the registration data bits contains the don't-care bit or the reference data bits contains the mask bit, the associated associative memory cell passes the current, and the current is detectable by the current detector circuit in so far as the other registration bits are matched with the other reference bits.

As will be appreciated from the foregoing description, the semiconductor associative memory device according to the present invention forms each associative memory cell with only two electrically erasable and programmable read only memory transistors TM1 and TM2, and the pair of data lines allow the associative memory cell to store the don't-care bit. This results in a small amount of occupation area without sacrifice of the usability. Moreover, the current flows through the column of associative memory cells only when the registration data bits are matched with the reference data bits, and the other columns of associative memory cells not matched with the reference data bits do not allow the current to flow therethrough. For this reason, the current consumption is decreased rather than the prior art associative memory devices.

Second Embodiment

Figure 8:
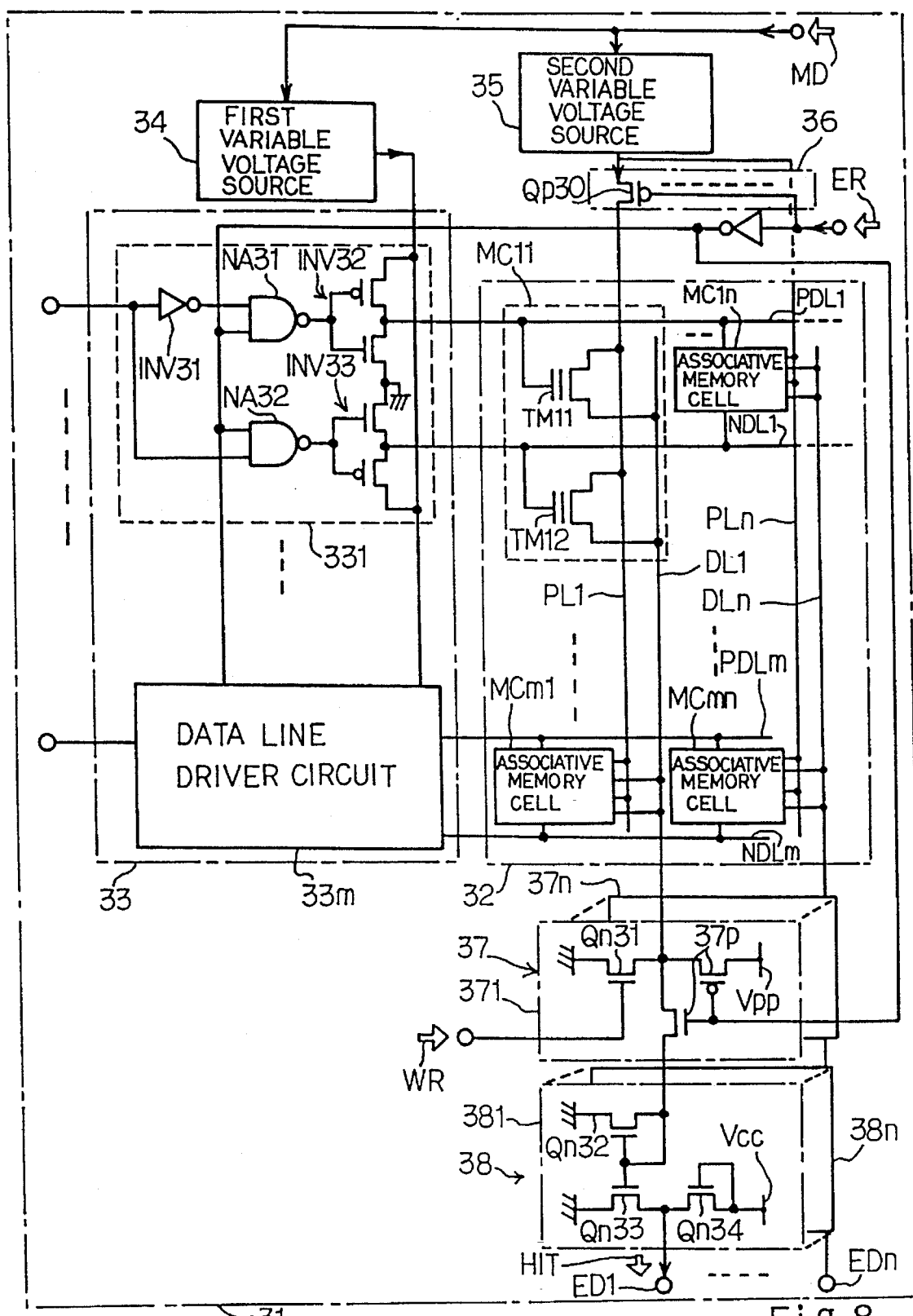
FIG. 8 is a circuit diagram showing the circuit arrangement of another semiconductor associative memory device according to the present invention.

Turning to FIG. 8 of the drawings, another semiconductor associative memory device embodying the present invention is fabricated on a semiconductor substrate 31, and largely comprises an associative memory cell array 32, a data line driver unit 33, a first variable voltage source 34, a second variable voltage source 35, a transfer gate array 36, an erasing unit 37 and a current detecting unit 38. The data line driver unit 33, the first variable voltage source 34 and the second variable voltage source 35 are similar to the data line driver unit 12, the first variable voltage source 13 and the second variable voltage source 18, and no further description is incorporated hereinbelow for these circuits.

The associative memory cell array 32 is implemented by a plurality of associative memory cells MC11 to MC1n, . . . and MCm1 to MCmn, and all of the associative memory cells MC11 to MCmn are identical in circuit arrangement to one another. Each of the associative memory cells MC11 to MCmn is implemented by two electrically erasable and programmable read only memory transistors TM11 and MT12, and these electrically erasable and programmable read only memory transistors TM11 and TM12 are floating gate type field effect transistors, and a typical example of the floating gate type field effect transistor is disclosed in Technical Report of Electronic Information Communication Society, ICD91-134.

The columns of associative memory cells MC11 to MCm1, . . . and MC1n to MCmn are respectively associated with a plurality of potential lines PL1 to PLn and a plurality of detecting lines DL1 to DLn, and the rows of associative memory cells MC11 to MC1n, . . . and MCm1 to MCmn are respectively associated with a plurality of pairs of data lines PDL1/NDL1 to PDLm/NDLm. The data lines PDL1 to PDLm and the data lines NDL1 to NDLm are hereinbelow referred to as "positive data lines" and "negative data lines", respectively. Though not shown in FIG. 8, an addressing unit is provided for the potential lines PL1 to PLn, and is responsive to an address signal for coupling the second variable voltage source 35 to one of the potential lines PL1 to PLn in a registration mode.

The positive data line and the negative data line of each pair are connected to the control gate electrodes of the electrically erasable and programmable read only memory transistors TM11 and the control gate electrodes of the electrically erasable and programmable read only memory transistors TM12 of the associated row of associative memory cells. The drain nodes of the electrically erasable and programmable read only memory transistors TM11 and TM12 of each column of associative memory cells are coupled to the associated potential line, and the source nodes of the electrically erasable and programmable read only memory transistors TM11 and TM12 are coupled to the associated detecting line. Thus, the electrically erasable and programmable read only memory transistors TM11 and TM12 of each associative memory cell are coupled in parallel between the associated potential line and the associated detecting line, and the are respectively gated by the positive data line and the negative data line.

The data line driver unit 33 has a plurality of data line driving circuits 331 to 33m respectively associated with the plurality pairs of data lines PDL1/NDL1 to PDLm/NDLm, and registration data bits and reference data bits are supplied to the data line driving circuits 331 to 33m depending upon the mode of operation. All of the data line driving circuits 331 to 33m are identical in circuit arrangement with one another, and each of the plurality of data line driving circuits 331 to 33m comprises an inverter INV31, two NAND gates NA31 and NA32 and two complementary inverters INV32 and INV33. The registration/reference data bit is supplied to the inverter INV31, and the inverter INV31 produces the complementary data bit. The registration/reference data bit and the complementary data bit are respectively supplied to the two NAND gates NA32 and NA31, and the NAND gates NA31 and NA32 are enabled with the complementary signal of the mode control signal ER. While the NAND gates NA31 and NA32 are being enabled, the NAND gates NA32 and NA31 are responsive to the registration/reference data bit and the complementary data bit for complementarily changing the complementary inverters INV32 and INV33.

The transfer gate array 36 is implemented by p-channel enhancement type transfer transistors Qp30, and the p-channel enhancement type transfer transistors Qp30 are responsive to a mode control signal ER. When the mode control signal ER is a high voltage level indicative of an erasing mode, the p-channel enhancement type transfer transistors Qp30 turn off, and the potential lines PL1 to PLn enter into open-state. On the other hand, if the mode control signal ER is a low voltage level indicative of the outside of the erasing mode, i.e., a registration mode and a retrieval mode, the n-channel enhancement type transfer transistors Qp30 turn on for supplying current from the second variable voltage source 35 to the potential lines PL1 to PLn. The addressing unit (not shown) may be coupled between the transfer gate array 36 and the potential lines PL1 to PLn.

The erasing unit 37 has a plurality of erasing circuits 371 to 37n respectively coupled to the detecting lines DL1 to DLn, and each of the plurality of erasing circuits 371 to 37n comprises an n-channel enhancement type switching transistor Qn31 coupled between the associated detecting line and a ground voltage line and a switching unit 37p selectively coupling the associated detecting line to a write-in voltage line Vpp and the current detecting unit 38. The n-channel enhancement type switching transistor Qn31 is responsive to a mode control signal W indicative of the registration mode for coupling the associated detecting line to the ground voltage line.

The switching unit 37p is responsive to the mode control signal ER. When the mode control signal ER is the low voltage level indicative of the erasing mode, the switching unit 37p couples the write-in voltage line Vpp to the associated detecting line. On the other hand, if the mode control signal ER is the high voltage level indicative of the other operation modes, i.e., the registration mode and the retrieval mode, the switching unit 37p couples the detecting line to the current detecting unit 38. However, while the semiconductor associative memory device is staying in the registration mode, current on the detecting line is discharged through the n-channel enhancement type switching transistor Qn31. In this instance, the erasing unit 37 serves as a third variable voltage source.

The current detecting unit 38 has a plurality of current detecting circuits 381 to 38n respectively coupled to the detecting lines DL1 to DLn, and each of the current detecting circuits 381 to 38n comprises a pair of n-channel enhancement type current-detecting transistors Qn32 and Qn33 concurrently gated by the associated detecting line and an n-channel enhancement type load transistor Qn34 coupled between a power voltage line Vcc and the drain node of the n-channel enhancement type current-detecting transistor Qn33. A hit signal HIT is supplied from the drain node of the n-channel enhancement type current-detecting detecting transistor Qn33 to an output node ED1.

Figure 9A:
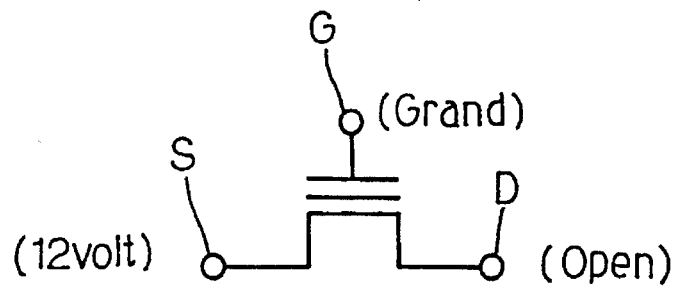
FIGS. 9A to 9C are views showing an electrically erasable and programmable read only memory transistor in a registration mode, an erasing mode and a retrieval mode.
Figure 9B:
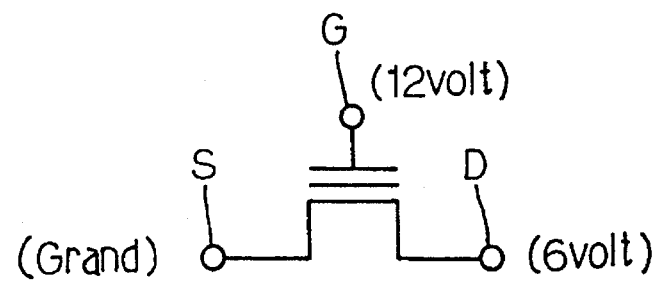
Figure 9C:
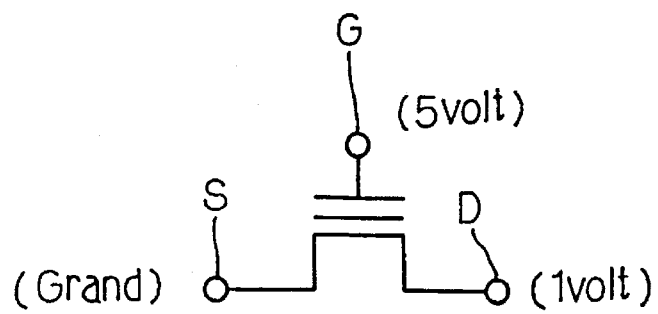

The semiconductor associative memory device thus arranged selectively enters into the erasing mode, the registration mode and the retrieval mode, and the electrically erasable and programmable read only memory are controlled as shown in FIGS. 9A to 9C. FIGS. 9A to 9C illustrate the electrically erasable and programmable read only memory transistor in the erasing mode, the registration mode and the retrieval mode, respectively.

When the semiconductor associative memory device enters into the erasing mode, the mode control signal ER of the high voltage level causes the transfer gate array 36 to isolate the potential lines PL1 to PLn from the second variable voltage source 35, and the potential lines PL1 to PLn enter in the open-state. The complementary signal of the mode control signal ER causes the switching units 37p to couple the write-in voltage line Vpp to the detecting lines DL1 to DLn, and disables the NAND gates NA31 and NA32 of the data line driver circuits 331 to 33m. The NAND gates NA31 and NA32 thus disabled cause the complementary inverters INV32 and INV33 to supply the ground voltage level to the positive and negative data lines PDL1/NDL1 to PDLm/NDLm. As a result, electrons are evacuated from the floating gate electrodes of the electrically erasable and programmable read only memory transistors TM11 and TM12 as the Fowler-Nordheim tunneling current, and all of the electrically erasable and programmable read only memory transistors TM11 and TM12 have a low threshold level.

In the registration mode, the semiconductor associative memory device behaves as follows. The first and second variable voltage sources 34 and 35 respond to a mode control signal MD, and supply 12 volts and 6 volts to the data line driver unit 33 and the transfer gate array 36. The mode control signal ER is changed to the low voltage level, and the n-channel enhancement type transfer transistors Qp30 turn on, and the complementary signal thereof causes the switching units 37p to isolate the detecting lines DL1 to DLn from the write-in voltage line Vpp. The mode control signal W of the high voltage level allows the n-channel enhancement type switching transistors Qn31 to turn on, and the detecting lines DL1 to DLn are coupled to the ground voltage line.

Though not shown in FIG. 8, the addressing unit sequentially couples the second variable voltage source 35 to the potential lines PL1 to PLn in synchronism with the registration data bits. Assuming now that a set of registration data bits is logic "1", . . . and logic "0", the data line driver circuits 331 to 33m change the negative data line NDL1, . . . and the positive data line PDLm to 12 volts, and the other data lines PDL1, . . . and NDLm are maintained at the ground voltage level. As a result, hot electrons are injected into the floating gate electrode of the electrically erasable and programmable read only memory transistor TM12 of the associative memory cell MC11, . . . and the floating gate electrode of the electrically erasable and programmable read only memory transistor TM11 of the associative memory cell MCm1, and the electrons accumulated in the floating gate electrodes change the thresholds of the electrically erasable and programmable read only memory transistors TM11 and TM12 to a high level. If the set of registration data bits contains a don't-care data bit, the data line driver circuit changes both of the associated positive and negative data lines to 12 volts, and injects hot electrons to the floating gate electrodes thereof. In this instance, the high threshold is equal to or greater than 5 volts, and the low threshold is of the order of 1 volt.

Thus, the addressing unit (not shown) changes the potential lines PL1 to PLn in synchronism with the set of registration data bits, and a plurality sets of registration data bits are stored in all of the columns of associative memory cells.

In the associative operation, the first and second variable voltage sources 34 and 35 supply 5 volts and 1 volt to the data line driver unit 33 and the transfer gate array 36 in response to the mode control signal MD. The mode control signal ER of the low voltage level causes the transfer gate array 36 to concurrently turn on, and the second variable voltage source 35 supplies 1 volt to all of the potential lines PL1 to PLn. The complementary signal of the mode control signal ER causes the switching unit 37p to couple the detecting lines PL1 to PLn to the current detecting circuits 381 to 38n. The mode control signal WR of the low voltage level changes the n-channel enhancement type switching transistors Qn31 to turn off.

Assuming now that reference data bits are logic "1" level, . . . and logic "0" level, the data line driver circuits 331 to 33m changes the negative data line NDL1, . . . and the positive data line PDLm to 5 volts, and the other data lines are maintained at the ground voltage level. The reference data bits are matched with the registration data bits stored in the column of associative memory cells MC11 to MCm1, and all of the data lines PDL1/NDL1 to PDLm/NDLm do not exceed the high and low thresholds of the electrically erasable and programmable read only memory transistors TM11 and TM12. As a result, the column of associative memory cells MC11 to MCm1 never provide a current path from the potential line PL1 to the detecting line DL1, and the current detecting circuit 381 supplies the hit signal HIT of the high voltage level to the associative pin ED1.

On the other hand, if the reference data bits are logic "0" level, . . . and logic "0" level, the reference data bits are not matched with the registration data bits stored in the column of associative memory cells MC11 to MCm1. The data line driver circuits 331 to 33m change the positive data line PDL1, . . . and the positive data line PDLm to 5 volts. The registration data bit stored in the associative memory cell MC11 is opposite in logic level to the reference data bit, and the positive data line PDL1 causes the electrically erasable and programmable read only memory transistor TM11 of the associative memory cell MC11 to turn on, because it has the low threshold. As a result, a current path is established between the potential line PL1 and the detecting line DL1, and the current causes the current-detecting circuit 381 to change the high signal HIT to the low voltage level. If the associative memory cell MC11 stores the don't-care bit, both of the electrically erasable and programmable read only memory transistors TM11 and TM12 have the high threshold, and remain in the off-state regardless of the reference data bit.

The associative operation is summarized in Table 4.

TABLE 4

| Reference data bit | | "0" | | "1" | |
|---|---|---|---|---|---|
| Voltage on data line | | 5 v | 0 v | 5 v | 0 v |
| R "0" | State | off | off | off | on |
| e | Current path | no | no | no | yes |
| g "1" | State | on | off | off | off |
| . | Current path | yes | no | no | no |
| b | | TM11 | TM12 | TM11 | TM12 |
| i | | | | | |
| t | | | | | |

As will be appreciated from the foregoing description, the associative memory cell occupies a small amount of area, and is allowed to store a don't-care bit.

Although particular embodiments of the present invention have been shown and described, it will be obvious to those skilled in the art that various changes and modifications may be made without departing from the spirit and scope of the present invention. For example, the semiconductor associative memory device according to the present invention may form a part of a large scale integration together with function blocks. Moreover, the electrically erasable and programmable read only memory transistor is not limited to the floating gate field effect transistor.

What is claimed is:

1. An associative memory device selectively entering into a registration mode and a retrieval mode, comprising:
   a) a plurality of addressable associative memory cells each implemented by a series combination of a first electrically erasable and programmable memory transistor and a second electrically erasable and programmable memory transistor, and formed into a plurality of associative memory cell groups;
   b) a plurality of pairs of data lines selectively provided for said plurality of addressable associative memory cells, the data lines of each pair being coupled to control gate electrodes of said first electrically erasable and programmable memory transistors of the associated addressable associative memory cells and control gate electrodes of said second electrically erasable and programmable memory transistors of said associated addressable associative memory cells;
   c) a plurality of potential lines selectively associated with said plurality of associative memory cell groups, said series combination of each of the associated addressable associative memory cells being inserted into the associated potential line;
   d) a variable voltage source connectable with said plurality of potential lines, and operative to supply a current to said plurality of potential lines;
   e) a data line driver unit coupled to said plurality of pairs of data lines,
      said data line driver unit being responsive to registration data bits in said registration mode for storing said registration data bits in said plurality of addressable associative memory cells, and operative to selectively energize the data lines of said plurality of pairs for changing one of said first electrically erasable and programmable memory transistor and said second electrically erasable and programmable memory transistor of each addressable associative memory cell to a non-conductive state depending upon the logic level of one of said registration data bits, said data line driver unit keeping both of said first electrically erasable and programmable memory transistor and said second electrically erasable and programmable memory transistor of one of said plurality of addressable associative memory cells in a conductive state when said one registration bit is a don't-care bit,
      said data line driver unit being responsive to reference data bits in said retrieval mode for selectively energizing said data lines of each pair, and checking said plurality of associative memory cell groups to determine whether or not said reference data bits are matched with said registration data bits stored in one of said plurality of associative memory cell groups, the first electrically erasable and programmable memory transistors and the second electrically erasable and programmable memory transistors of one of said plurality of associative memory cell groups being conductive when the registration data bits stored therein are matched with said reference data bits; and
   f) a current detecting unit connectable to said plurality of potential lines for detecting said current passing through one of said plurality of associative memory cell groups storing said registration data bits matched with said reference data bits, and operative to produce a hit signal indicative of the match between said reference data bits and said registration data bits.

2. The associative memory device as set forth in claim 1, in which said reference data bits contain a mask bit, said mask bit causing said data line driver unit to drive both data lines of the associated pair for making the first electrically erasable and programmable memory transistors and the second electrically erasable and programmable memory transistors of the associated addressable associative memory cells conductive.

3. The associative memory device as set forth in claim 1, in which each of said first electrically erasable and programmable memory transistor and said second electrically erasable and programmable memory transistor is a field effect transistor having a floating gate electrode in a gate insulating layer between a channel region and a control gate electrode coupled to the associated data line.

4. The associative memory device as set forth in claim 3, further having an erasing mode for making said first electrically erasable and programmable memory transistors and said second electrically erasable and programmable memory transistors conductive by evacuating carriers from the floating gate electrodes.

5. The associative memory device as set forth in claim 3, further comprising
   g) an addressing unit for selectively making said plurality of associative memory cell groups changeable from said conductive-state to said non-conductive state by injecting carrier into the floating gate electrode in said registration mode.

6. An associative memory device selectively entering into a registration mode, a retrieval mode and an erasing mode, comprising:
   a) a plurality of addressable associative memory cells each implemented by a parallel combination of a first electrically erasable and programmable memory transistor and a second electrically erasable and programmable memory transistor, and formed into a plurality of associative memory cell groups;

b) a plurality of pairs of data lines selectively provided for said plurality of addressable associative memory cells, the data lines of each pair being coupled to control gate electrodes of said first electrically erasable and programmable memory transistors of the associated addressable associative memory cells and control gate electrodes of said second electrically erasable and programmable memory transistors of the associated addressable associative memory cells;

c) a plurality of potential lines selectively associated with said plurality of associative memory cell groups, a drain node of said first electrically erasable and programmable memory transistor and a drain node of said second electrically erasable and programmable memory transistor of each addressable associative memory cell being coupled to the associated potential line;

d) a plurality of detecting lines selectively associated with said plurality of associative memory cell groups, a source node of said first electrically erasable and programmable memory transistor and a source node of said second electrically erasable and programmable memory transistor of each addressable associative memory cell being coupled to the associated detecting line;

e) a first variable voltage source for producing voltage levels depending upon the modes of operation;

f) a second variable voltage source connectable with said plurality of potential lines, and operative to supply a voltage level to said plurality of potential lines in said registration mode and said retrieval mode;

g) a third variable voltage source connectable to said plurality of detecting lines, and operative to supply a voltage level depending upon the modes of operation;

h) a data line driver unit supplied with said voltage levels from said first variable voltage source for driving said plurality of pairs of data lines, said data line driver unit being responsive to registration data bits in said registration mode for storing said registration data bits in said plurality of addressable associative memory cells, and operative to selectively energize the data lines of said plurality of pairs so as to cause said first electrically erasable and programmable memory transistor and said second electrically erasable and programmable memory transistor of each addressable associative memory cell to enter into a conductive-state and a non-conductive state depending upon the logic level of one of said registration data bits, said data line driver unit keeping both of said first electrically erasable and programmable memory transistor and said second electrically erasable and programmable memory transistor of one of said plurality of addressable associative memory cells in said conductive state when the registration bit is a don't-care bit, said data line driver unit being responsive to reference data bits in said retrieval mode for selectively energizing said data lines of each pair, and checking said plurality of associative memory cell groups to determine whether or not said reference data bits are matched with said registration data bits stored in one of said plurality of associative memory cell groups, the first electrically erasable and programmable memory transistors and the second electrically erasable and programmable memory transistors of one of said plurality of associative memory cell groups being non-conductive when the registration data bits stored therein are matched with said reference data bits; and i) a current detecting unit connectable to said plurality of detecting lines for detecting current supplied from said second variable voltage source through said plurality of associative memory cell groups storing said registration data bits mismatched with said reference data bits, and operative to produce a hit signal indicative of the match between said reference data bits and said registration data bits when no current is detected.

* * * * *